(12) United States Patent
Watanabe et al.

(10) Patent No.: US 10,991,542 B2
(45) Date of Patent: Apr. 27, 2021

(54) CHARGED PARTICLE BEAM DEVICE

(71) Applicant: Hitachi High-Technologies Corporation, Tokyo (JP)

(72) Inventors: Ryota Watanabe, Tokyo (JP); Yuko Sasaki, Tokyo (JP); Kazunari Asao, Tokyo (JP); Makoto Suzuki, Tokyo (JP); Wataru Mori, Tokyo (JP); Minoru Yamazaki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/477,986

(22) PCT Filed: Jan. 27, 2017

(86) PCT No.: PCT/JP2017/002968
§ 371 (c)(1),
(2) Date: Jul. 15, 2019

(87) PCT Pub. No.: WO2018/138875
PCT Pub. Date: Aug. 2, 2018

(65) Prior Publication Data
US 2019/0362931 A1    Nov. 28, 2019

(51) Int. Cl.
*H01J 37/22*        (2006.01)
*H01J 37/244*       (2006.01)
(Continued)

(52) U.S. Cl.
CPC ............ *H01J 37/222* (2013.01); *H01J 37/10* (2013.01); *H01J 37/244* (2013.01); *H01J 37/28* (2013.01);
(Continued)

(58) Field of Classification Search
CPC ........ H01J 37/10; H01J 37/222; H01J 37/244; H01J 37/28; H01J 2237/221;
(Continued)

(56) References Cited

U.S. PATENT DOCUMENTS 8,841,612 B2    9/2014   Fukuda et al.
9,261,360 B2 *  2/2016   Okai ...................... G01B 15/04
(Continued)

FOREIGN PATENT DOCUMENTS

JP    2002-319366 A    10/2002
JP    2005-166472 A     6/2005
(Continued)

OTHER PUBLICATIONS

International Search Report (PCT/ISA/210) issued in PCT Application No. PCT/JP2017/002968 dated May 30, 2017 with English translation (six (6) pages).
(Continued)

*Primary Examiner* — David E Smith
(74) *Attorney, Agent, or Firm* — Crowell & Moring LLP

(57) ABSTRACT

The purpose of the present invention is to provide a charged particle beam device which adjusts brightness and contrast or adjusts focus and the like appropriately in a short time even if there are few detected signals. Proposed as an aspect for achieving this purpose is a charged particle beam device provided with: a detector for detecting charged particles obtained on the basis of irradiation of a specimen with a charged particle beam emitted from a charged particle source; and a control unit for processing a signal obtained on the basis of the output of the detector, wherein the control unit performs statistical processing on gray level values in a predetermined region of an image generated on the basis of the output of the detector, and executes signal processing for correcting a difference between a statistical value obtained
(Continued)

CONFIGURATION OF CHARGED PARTICLE BEAM DEVICE by the statistical processing and reference data relating to the gray level values of the image.

11 Claims, 13 Drawing Sheets

(51) Int. Cl.
    *H01J 37/10*     (2006.01)
    *H01J 37/28*     (2006.01)

(52) U.S. Cl.
    CPC . *H01J 2237/221* (2013.01); *H01J 2237/2448* (2013.01); *H01J 2237/281* (2013.01); *H01J 2237/2806* (2013.01); *H01J 2237/2817* (2013.01)

(58) Field of Classification Search
    CPC ....... H01J 2237/2448; H01J 2237/2806; H01J 2237/281; H01J 2237/2817
    See application file for complete search history.

(56) References Cited

U.S. PATENT DOCUMENTS

| | | | |
|---|---|---|---|
| 2011/0155905 A1* | 6/2011 | Hatakeyama | H01J 37/244 250/307 |
| 2012/0098952 A1* | 4/2012 | Nakahira | H01J 37/28 348/79 |
| 2012/0300056 A1* | 11/2012 | Ban | H01J 37/21 348/80 |
| 2013/0206986 A1* | 8/2013 | Suzuki | H01J 37/263 250/310 |
| 2014/0061455 A1* | 3/2014 | Ishii | H01J 37/263 250/252.1 |

FOREIGN PATENT DOCUMENTS

| | | |
|---|---|---|
| JP | 2007-329081 A | 12/2007 |
| JP | 2007329081 A * | 12/2007 |

OTHER PUBLICATIONS

Japanese-language Written Opinion (PCT/ISA/237) issued in PCT Application No. PCT/JP2017/002968 dated May 30, 2017 (eight (8) pages).

* cited by examiner

[FIG. 1]
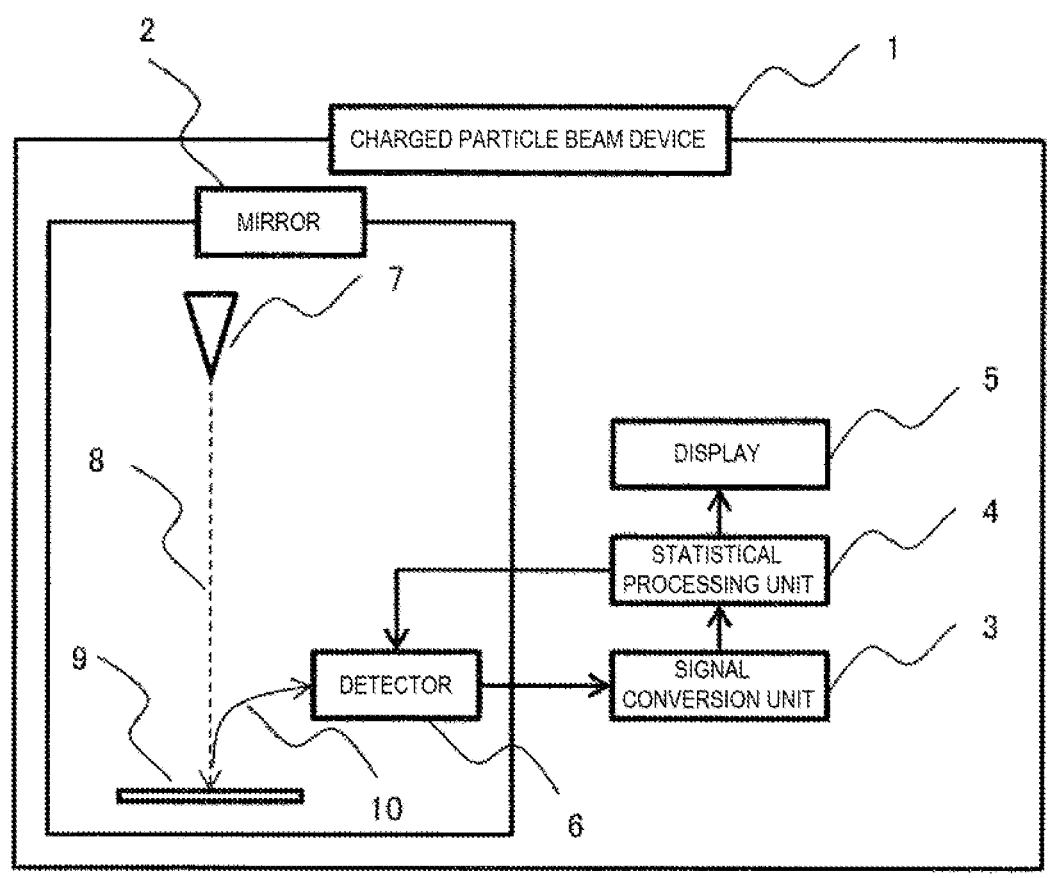
CONFIGURATION OF CHARGED PARTICLE BEAM DEVICE

[FIG. 2]
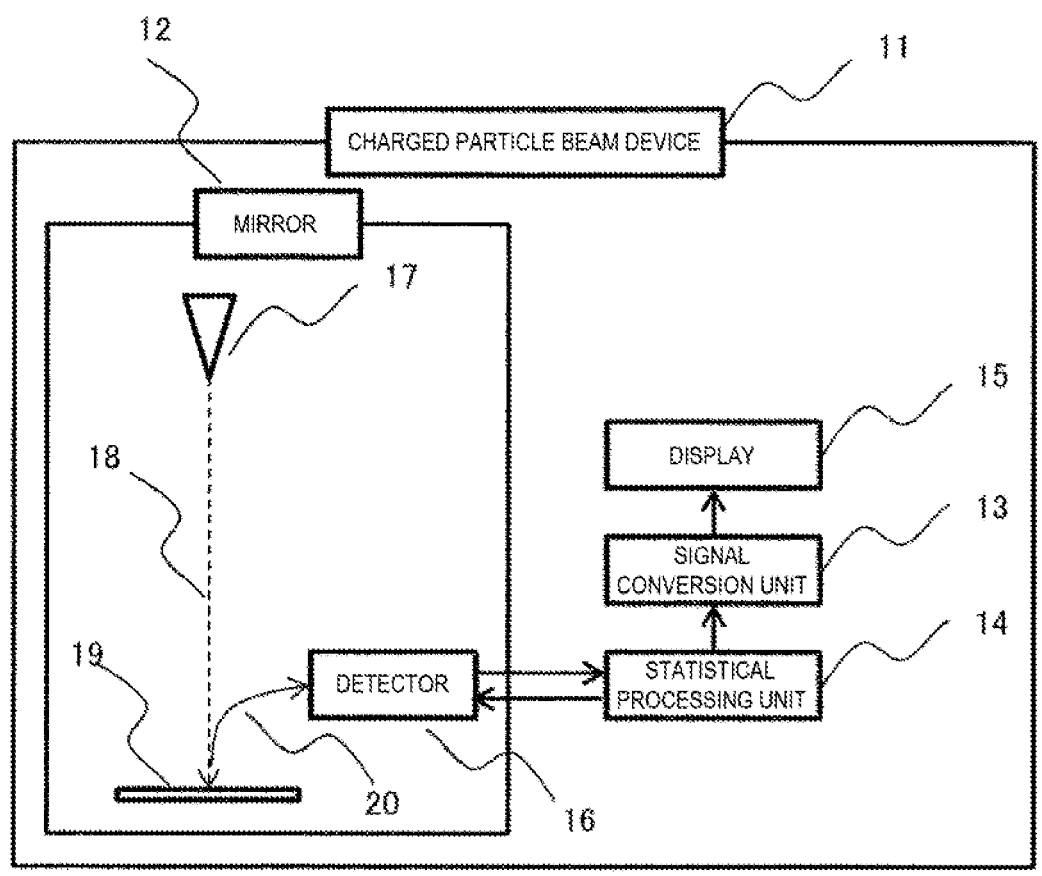
CONFIGURATION OF CHARGED PARTICLE BEAM DEVICE

[FIG. 3]
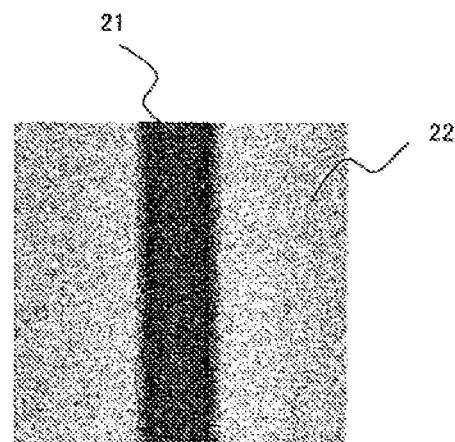
SCHEMATIC DIAGRAM OF
OBSERVATION IMAGE OF SPECIMEN

[FIG. 4]
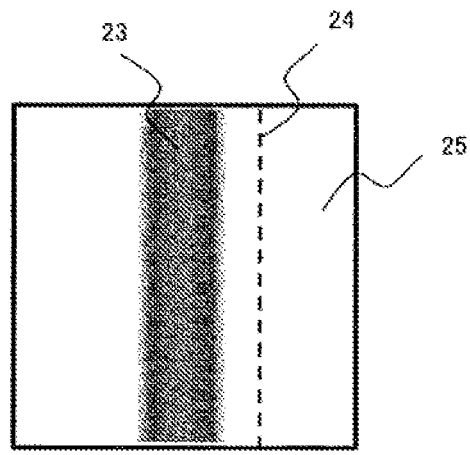
SCHEMATIC DIAGRAM OF
OBSERVATION IMAGE OF SPECIMEN
[FIG. 5]
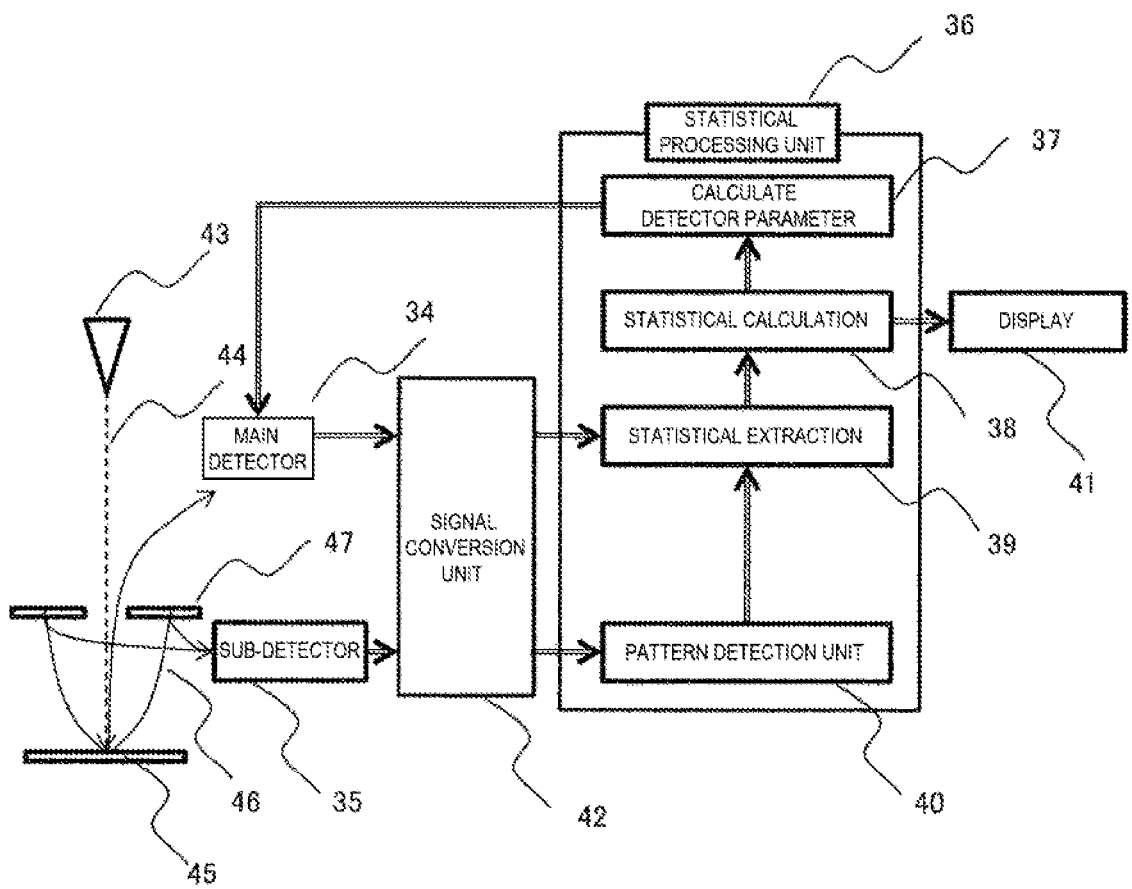
CONFIGURATION OF CHARGED PARTICLE BEAM DEVICE

[FIG. 6]
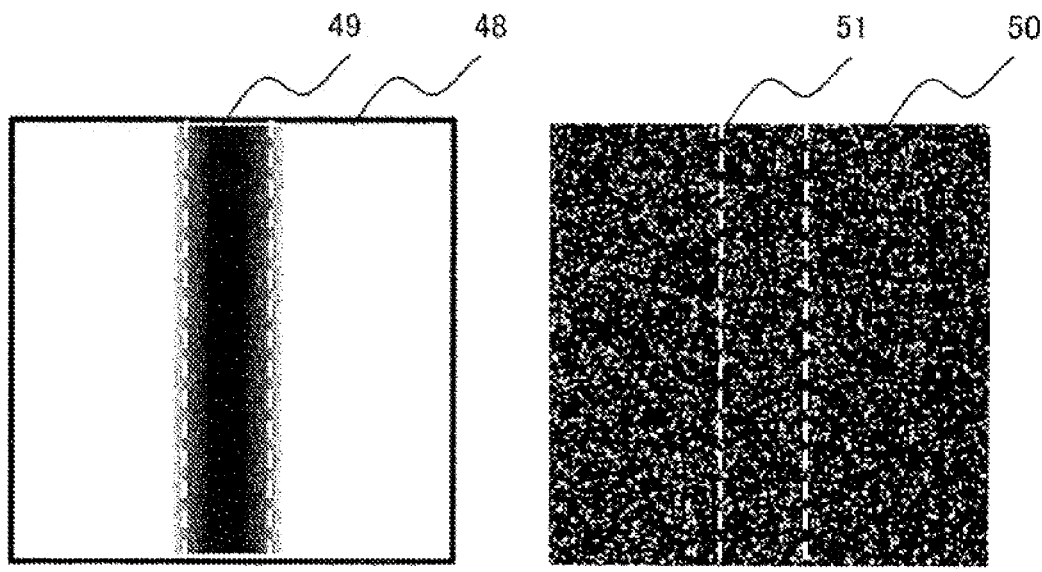
SCHEMATIC DIAGRAM OF OBSERVATION IMAGE OF SPECIMEN
[FIG. 7]
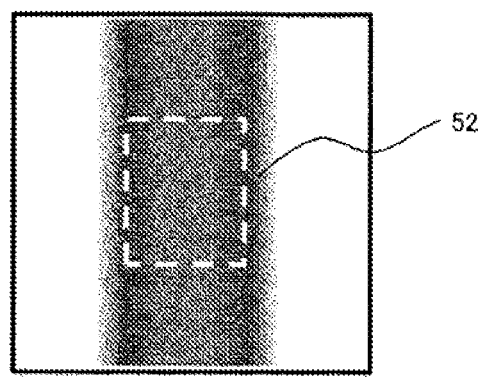
SCHEMATIC DIAGRAM OF
OBSERVATION IMAGE OF SPECIMEN

[FIG. 8]
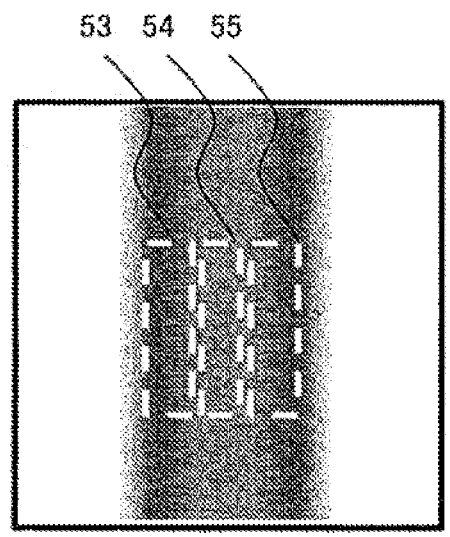
SCHEMATIC DIAGRAM OF
OBSERVATION IMAGE OF SPECIMEN
[FIG. 9]
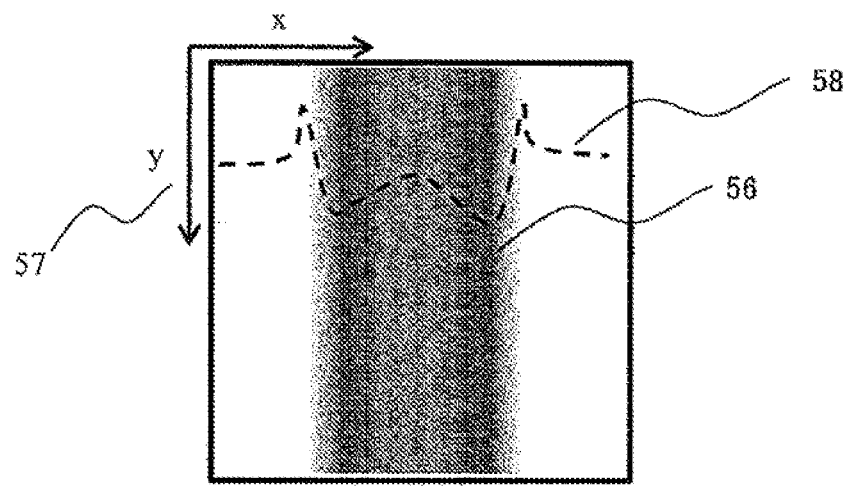
SCHEMATIC DIAGRAM OF OBSERVATION IMAGE OF SPECIMEN

[FIG. 11]
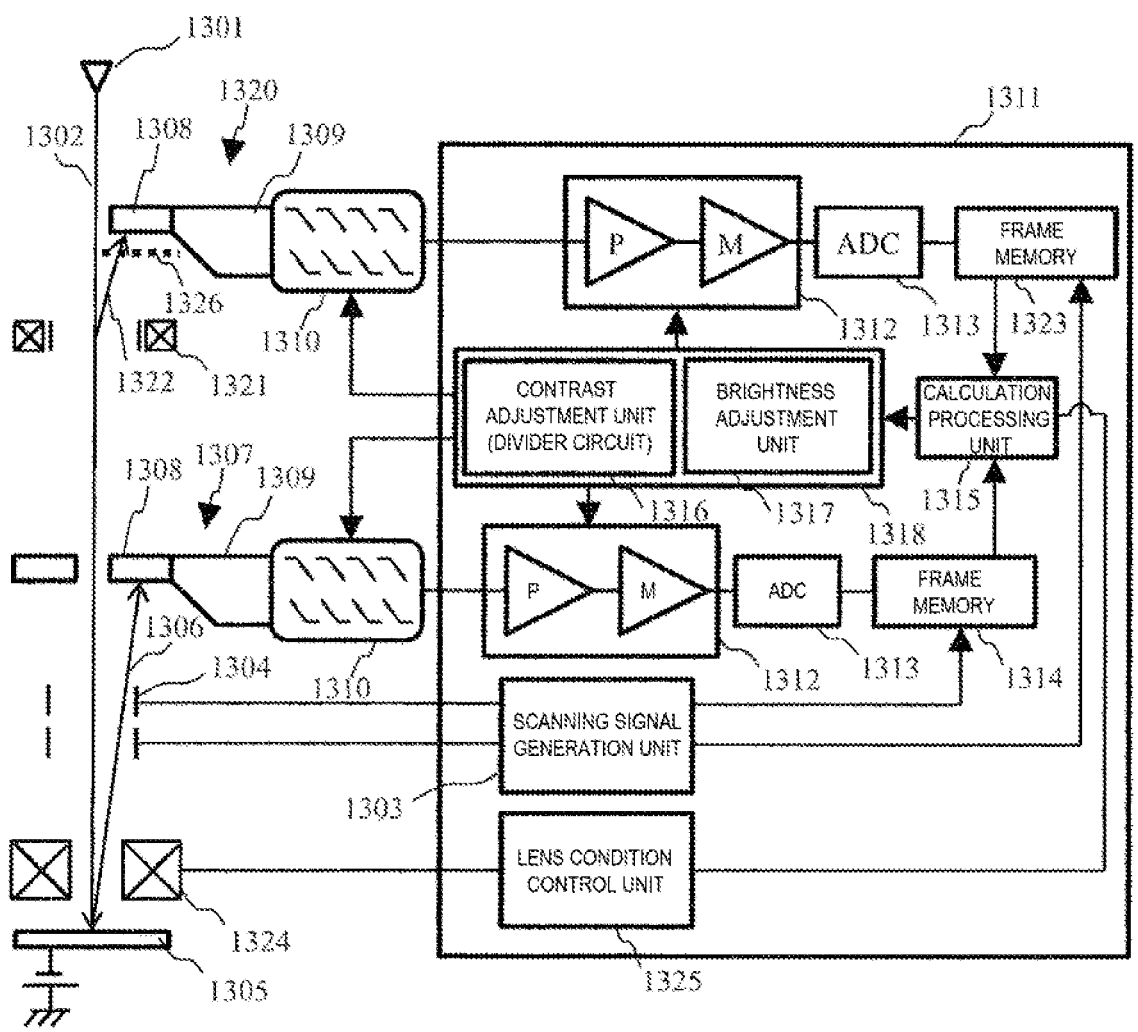

[FIG. 12]
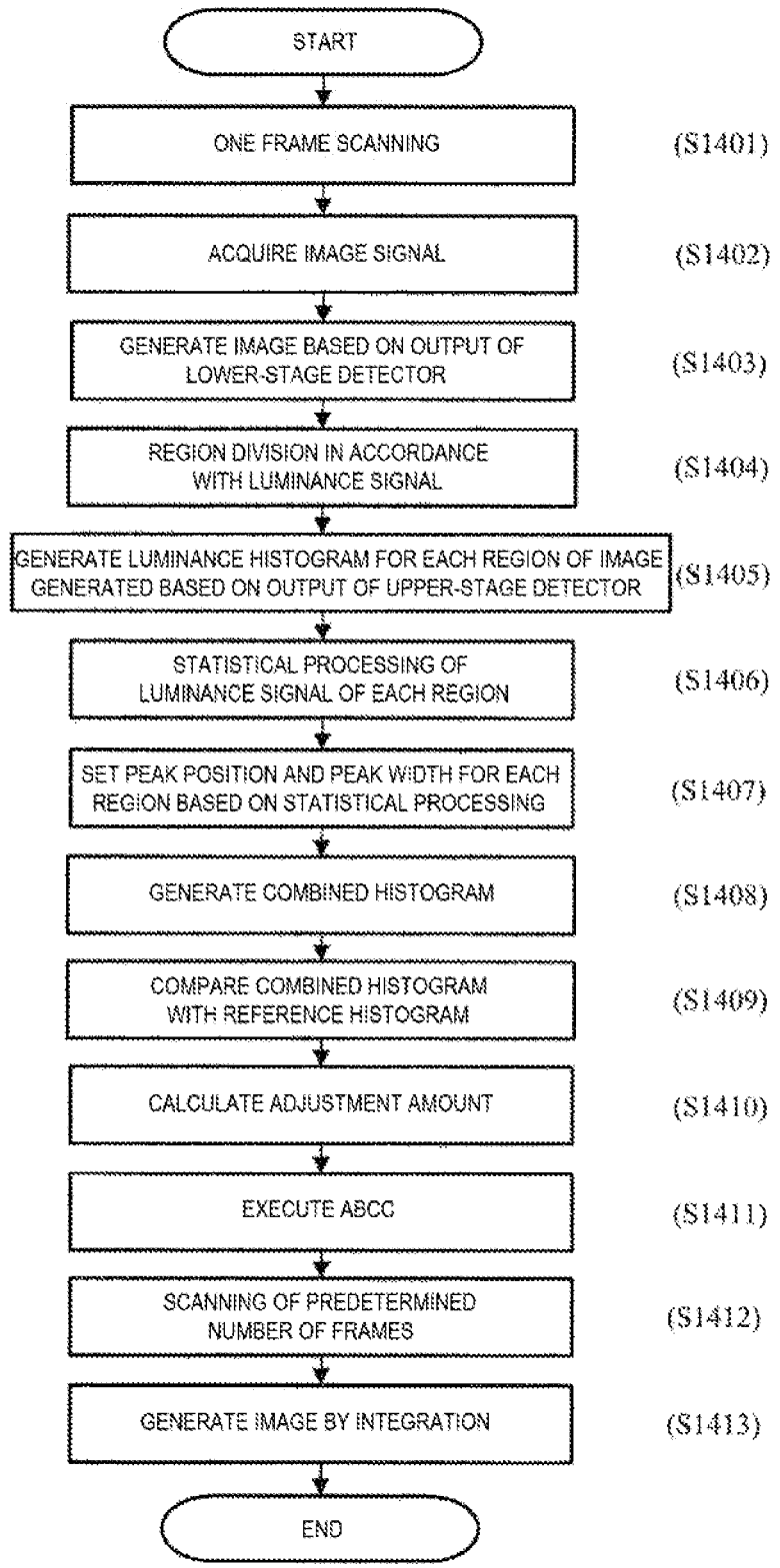

[FIG. 15]
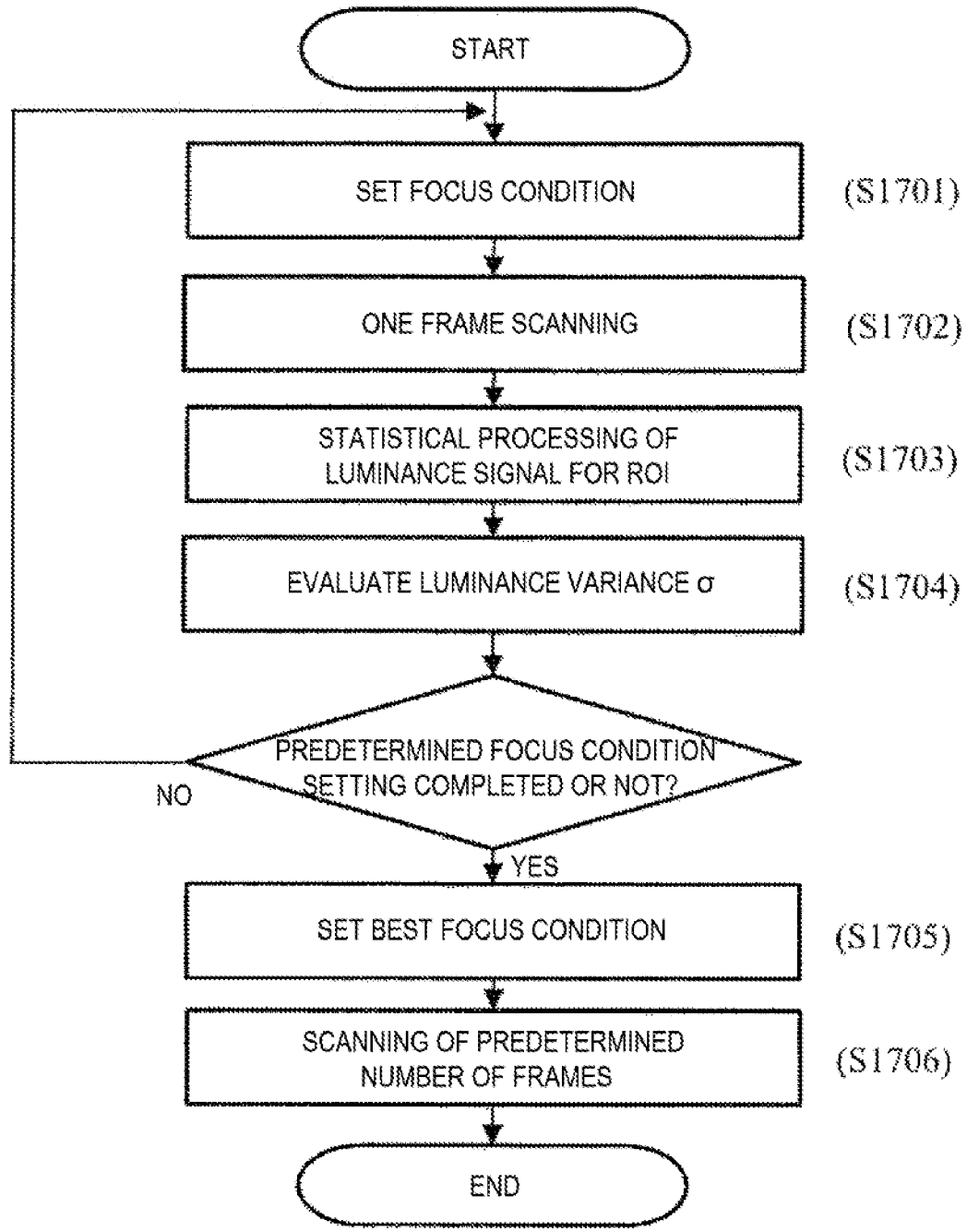

CHARGED PARTICLE BEAM DEVICE

TECHNICAL FIELD

The present disclosure relates to a charged particle beam device, and particularly to a charged particle beam device capable of properly processing a signal obtained by scanning a specimen with a beam.

BACKGROUND ART

A Scanning Electron Microscope (SEM), which is one of charged particle beam devices, is a device that emits signal electrons from a specimen and detects the signal electrons with a detector by scanning a fine object with an electron beam, and performs observation or inspection of the specimen, measurement of a dimension and the like on the basis of a detection signal.

One of adjustments when generating an image on the basis of the detection signal is an adjustment of contrast and brightness of the image. In addition, as a function of automatically adjusting brightness and contrast, an Automatic Brightness Contrast Control (ABCC) function is known. Patent Literature 1 describes a method of adjusting brightness and contrast of a detector such that the brightness of a region of interest in a visual field is optimal. Patent Literature 2 describes a method of acquiring information of a hole bottom and a groove bottom of a specimen in a short time, and a method of adjusting brightness and contrast of a detector.

PRIOR ART LITERATURE

Patent Literature

PTL 1: JP-A-2002-319366
PTL 2: Japanese Patent No. 5655064 (corresponding to U.S. Pat. No. 8,841,612)

SUMMARY OF INVENTION

Technical Problem

When observing the bottom of a fine groove structure or a hole structure, it is necessary to set a device condition such as brightness and contrast of the detector to a value suitable for bottom observation. In the method shown in Patent Literature 1, the region of interest in the visual field is automatically or manually selected, and the ABCC is performed. At this time, image integration to such an extent that the contrast of the region of interest can be detected is necessary. Patent Literature 2 describes a method of improving S/N by outputting an image on the basis of the number of detection signals when the number of signals detected is equal to or less than one per pixel. In this method, the number of gray levels that can be used to draw the region of interest remains around the number of the detection signals. Therefore, under a condition where stronger signal discrimination is necessary, roughness in image quality of the region of interest is generated, and sufficient information for dimension measurement and defect inspection may not be obtained.

Hereinafter, a charged particle beam device whose purpose is to properly perform brightness adjustment, contrast adjustment, or focus adjustment or the like in a short time even when there are a small number of detection signals is proposed.

Solution to Problem

Proposed as an aspect for achieving this purpose is a charged particle beam device including a detector that detects charged particles obtained on the basis of irradiation of a specimen with a charged particle beam emitted from a charged particle source, and a control unit that processes a signal obtained on the basis of output of the detector. The control unit performs statistical processing on gray level values in a predetermined region of an image generated on the basis of the output of the detector, and executes signal processing for correcting a difference between a statistical value obtained by the statistical processing and reference data relating to gray level values of the image.

Further, proposed as another aspect for achieving the above purpose is a charged particle beam device including an objective lens that focuses a charged particle beam emitted from a charged particle source, a detector that detects charged particles obtained on the basis of irradiation of a specimen of the charged particle beam, and a control unit that processes a signal obtained on the basis of output of the detector. The control unit performs statistical processing on gray level values in a predetermined region of an image generated on the basis of the output of the detector, and adjusts a lens condition of the objective lens on the basis of an evaluation of the statistical value obtained by the statistical processing.

Further, proposed as another aspect for achieving the above purpose is a charged particle beam device including an objective lens that focuses a charged particle beam emitted from a charged particle source, a detector that detects charged particles obtained on the basis of irradiation of a specimen of the charged particle beam, and a control unit that processes a signal obtained on the basis of output of the detector. The control unit adjusts a lens condition of the objective lens so as to reduce a variance value obtained on the basis of gray level values in a predetermined region of an image generated on the basis of the output of the detector.

Advantageous Effect

According to the above configuration, even when there are a small number of detection signals, brightness adjustment, contrast adjustment, or focus adjustment, or the like can be performed properly in a short time.

BRIEF DESCRIPTION OF DRAWINGS

FIG. 1 is a diagram showing a configuration of a charged particle beam device.

FIG. 2 is a diagram showing a configuration of a charged particle beam device.

FIG. 3 is a diagram showing an example of an image obtained by a charged particle bean device.

FIG. 4 is a diagram showing an example of an image obtained by a charged particle bean device.

FIG. 5 is a diagram showing a configuration of a charged particle beam device including two detectors.

FIG. 6 is a diagram showing an example of an image obtained by a charged particle bean device.

FIG. 7 is a diagram showing an example of an image obtained by a charged particle beam device.

FIG. 8 is a diagram showing an example of an image obtained by a charged particle beam device.

FIG. 9 is a diagram showing an example of an image obtained by a charged particle beam device.

FIG. 11 is a diagram showing an outline of a charged particle beam device including two detectors and a control unit that processes a detector output.

FIG. 12 is a flowchart showing a brightness and contrast adjustment step of the charged particle beam device.

FIG. 15 is a flowchart showing an autofocus processing step on the basis of a signal obtained by one frame scanning.

DESCRIPTION OF EMBODIMENTS

Figure 10A:
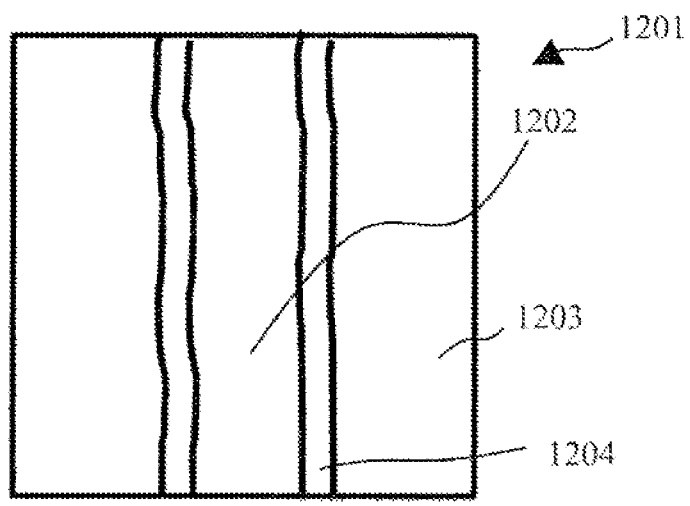
FIGS. 10A to 10C are diagrams showing a groove pattern image and an example in which a luminance evaluation region is set in each region of the groove pattern image.

An embodiment described below relates to a charged particle beam device, and particularly relates to a charged particle beam device which can extract and process statistical information related to a visual field and the number of times of beam scanning for a signal from a specimen.

Signal detection and image output using an SEM may require a clear visualization of a region of interest or a characteristic of interest of a user in a specimen. For example, in a manufacturing step of a semiconductor device, dimension measurement of a fine groove structure or a hole structure, extraction or inspection of a defect, and a state of a surface, a bottom portion, and aside wall of a three-dimensional structure are observed along with integration of a circuit pattern. In order to clearly observe such a pattern, a detector that selectively captures a component that reflects desired characteristic information in a signal emitted from a specimen is required.

In the embodiments described below, for example, a charged particle beam device is described, which includes a detector that detects charged particles obtained on the basis of a charged particle source and irradiation with a beam emitted from the charged particle source with respect to a specimen, and has a function of extracting and calculating statistical information related to an arbitrary region and frame integration in the visual field from a detection signal obtained by the detector.

According to the above configuration, even under an observation condition where there are a small number of detection signals, it is possible to acquire gray level values with little variation in a short time. Then, the brightness and contrast of the detector can be adjusted on the basis of the gray level values.

The following description relates to a charged particle beam device, and particularly to a device having a function of extracting and calculating statistical information related to the visual field and the number of times of beam scanning of a detection signal obtained on the basis of irradiation with a charged particle beam.

The charged particle beam device includes a focused ion beam device in addition to the SEM. Further, as examples of the SEM according to a specific application, there are a length measuring electron microscope that measures a dimension of a circuit pattern formed on a semiconductor wafer and a review electron microscope that observes and analyzes a defect of a foreign matter or a structure in detail.

In the SEM, a gray level value is assigned to each pixel of an image on the basis of a detection signal. For example, in the case of an 8-bit image, the detection signal is classified into the eighth power of 2 of, that is, 256, discrete gray level values. When the image is displayed on a display, a gray level value 0 is set to black, 255 is set to white, and a gray scale is set therebetween. The ABCC sets the brightness and contrast of the detector so as to have a gray level value suitable for visibility, dimension measurement, or accuracy of defect inspection or the like of the region of interest. Further, the measurement of the dimension of the semiconductor pattern is performed by acquiring and analyzing distribution of the gray level values in the region of interest based on an image of the SEM. Therefore, acquiring the gray level values at high speed and reducing the variation thereof are important for improving the measurement, inspection accuracy of the device and for reaching high throughput.

As a method of reducing the variation in the gray level values, for example, the following three methods can be used.

(1) Method of acquiring a large number of signals by scanning with a beam a plurality of times (2) Method of increasing current (3) Method of improving detection efficiency of signal electrons The method (1) increases image acquisition time as the number of times of the scanning increases. Further, in the methods (1) and (2), charging, contamination, and damage of the specimen are likely to be generated. In recent years, there has been proposed a method of emphasizing a region of interest by discriminating energy of a signal electron or an emission angle on a specimen when a complex specimen is observed. The effect of the method (3) is also limited since a total amount of the signals is reduced by signal discrimination. The invention proposes a method of reducing the variation in gray level values under a small number of times of beam scanning or a small current condition by providing a calculation unit that performs statistical processing related to the visual field and integrated frame in each pixel of the image. As one aspect of the device, configurations of FIGS. 1 and 2 are proposed. Here, statistical processing units 4 and 14 respectively take a gray level value and a detection signal of the image as an input, and have a logic circuit that performs extraction and calculation of an average value, a variance value, frequency, a probability distribution function, statistical inspection, and estimation of the gray level value and the detection signal.

In the SEM, the specimen is scanned two-dimensionally with an electron beam, and a position X=(x, y) on the specimen corresponds to a pixel P=(p, q) of the display. Each pixel is assigned a gray level value calculated from intensity and frequency of the signal. When a gray level value output on the basis of one time of beam scanning is set to $S_n(P)$, a gray level value $S_M(P)$ obtained by M times of integration can be determined by an average value of $S_n(P)$, that is, by Formula 1.

$$S_M(P) = \frac{1}{M} \sum_{n=1}^{M} S_n(P) \qquad \text{(Formula 1)}$$

For the sake of simplicity, a pixel-related argument P will not be specified hereinafter unless otherwise stated.

FIG. 3 is a schematic diagram of an observation image of a groove pattern of a semiconductor. When an integrated frame number N is small, variation in the gray level value of each pixel along with the pattern image, that is, so-called spike noise (or referred to as salt-and-pepper noise) becomes significant. Therefore, a noise component appears strongly in a line profile calculated on the basis of the gray level value. As a result, when the dimension of the pattern is measured, measurement variation of the dimension becomes large. A method of calculating a gray level value at a time of M (>>N) integration using statistical processing from an N frame integrated image and integration processing thereof will be described in order to reduce the variation in the gray level values. The method of statistical processing is roughly classified into the following (A) and (B) according to the matters of interest.

(A) Information relating to brightness of an entire image or a partial region, such as a gray level histogram (B) Gray level value of each pixel and a difference between each pixel and surrounding pixels (A) is information necessary for adjusting the brightness and contrast of the detector. (B) is information necessary at a time of dimension measurement or defect inspection. For example, there is a growing need to perform a wide range of defect inspection by using a low-magnification image that provides a wide visual field or simultaneously scanning a specimen with a plurality of beams. In such a case, since the region of interest is reduced in the visual field, even if an abnormal gray level value is obtained in the region of interest, it is necessary to distinguish between the abnormality of the specimen or the above spike noise with high accuracy.

First Embodiment

The method of (A) will be described. In an observation example of a groove in FIG. 3, a bottom portion 21 becomes darker than a surface 22 since a part of the signal electrons emitted from the bottom portion 21 collide with a side wall and are lost. That is, a small gray level value is assigned. In the region of each of the surface 22 and the bottom portion 21, characteristics such as energy and an emission angle of the signal electrons emitted at a time of beam irradiation and frequency thereof are the same. Thus, a sum of n in Formula (1) can be replaced by a sum of pixels of the same image. Further, when an average of the gray level values of one frame is set to E and a variance thereof is set to $\sigma$ in one pixel in the region, a statistical distribution (E, $\sigma$) is the same in each pixel in the region. On the other hand, the distribution of the gray level values at a time of M (>>1) frame integration of the pixel becomes a normal distribution of (E, $\sigma/\sqrt{M}$) on the basis of the central limit theorem of probability theory and statistics. That is, an M frame gray level histogram of the region can be calculated by extracting the distribution (E, $\sigma$) of the gray level value of a desired region from a certain image.

When a specimen is observed using secondary electrons, a phenomenon in which an edge portion of a pattern becomes white is known. In such a case, the gray level is not uniform on the surface and the bottom portion in FIG. 3, and an image with gradation as shown in FIG. 4 is obtained. However, for example, the same processing can be performed by designating a linear region 25 based on a distance from the edge of the pattern.

Second Embodiment

A method of implementing ABCC that automatically adjusts brightness and contrast of a detector using the statistical processing described above is described. When the signal amount is sufficiently large, region division and statistical processing in each region described in (A) can be simultaneously performed by using one frame or a low frame image. A related method illustrated in the following (a) and (b) may be used on the basis of an M frame gray level histogram obtained by the statistical processing.

(a) The brightness and the contrast are adjusted such that the gray level value of one desired region or a plurality of desired regions becomes a desired value.

(b) The brightness and the contrast are adjusted such that the base of a peak in the gray level value histogram of the entire image or the desired region has a desired value.

In the method (b), the gray level value is calculated on the basis of the large deviation principle of the stochastic and statistics instead of the central limit theorem described in (A), which may reach higher accuracy.

On the other hand, when reflection electrons are detected or signal discrimination is performed by using an energy filter, the pattern cannot be confirmed in a low frame image. In order to cope with such a case, a sub-detector 35 shown in FIG. 5 is added. The ABCC of a main detector 34 is implemented using the sub-detector 35 and a statistical processing 36. The added sub-detector 35 detects signal electrons, for example, secondary electrons that are not captured by the main detector 34 for signal discrimination. Then, the number of signals of the sub-detector 35 is larger than that of the main detector 34, and the pattern can be recognized even by integration of low frames. In addition, a pattern shape in the visual field can be clearly detected by the characteristics of the secondary electrons. Therefore, as shown in FIG. 6, a region division 49 of a visual field of the main detector 34 is performed based on the image of the sub-detector 35, which is on the basis of beam scanning of one frame. Then, the distribution of the gray level values of each region is statistically processed based on the image of the main detector by the method described in (A). An M frame gray level histogram obtained by the statistical processing is obtained. The ABCC is executed by the method (a) or (b) using the histogram. In this way, the ABCC for the image of M (>>1) frames can be implemented by the beam scanning of one frame or less to the beam scanning of several frames.

In the method described above, a plurality of detectors is used to extract and process the region division and the gray level value histogram simultaneously. Even in a device that does not have a detector having a function corresponding to the sub-detector, the same ABCC can be implemented by performing the beam scanning a plurality of times by changing a parameter of the detector and the beam irradiation amount. For example, a case where the presence or absence of the signal discrimination is controlled by ON and OFF of the energy filter is considered. Beam scanning is performed under the OFF condition of the energy filter, and the region division of the visual field is performed from the obtained image. Then, beam scanning for implementing the ABCC by switching the energy filter to ON is performed. In order to perform the region division, a beam scanning speed and an irradiation current amount of the electron beam may be changed. In these methods, the execution time of the ABCC becomes longer than when the sub-detector is used. In addition, due to the switching of the conditions, a visual field deviation or the like is generated, which may deteriorate the calculation accuracy of the statistical processing.

Depending on the sample to be observed or the accuracy required for the ABCC, specimen charging or contamination during frame integration may become a problem. In this case, variation in the distribution of the gray level values by the beam scanning of n frames may be corrected. For example, the distribution is extracted at the n-th frame at a time of M frame integration, and a trend thereof is monitored. Then, when an average value E varies beyond an allowable value, the subsequent ABCC corrects the trend obtained in the process of acquiring the image. Since the correction method depends on a main cause of the trend, an optimum correction method may be selected in accordance with the situation. For example, a correction term $\varepsilon_n$ and a correction factor $\eta_n$ are introduced, E is replaced by E+$\varepsilon_n$, and $\sigma_n$ is replaced by $\sigma_n \times \sqrt{\eta_n}$.

The same ABCC can be executed even if specimen charging or contamination is generated since the central limit theorem used in (A) includes a correction value.

Hereinafter, more specific embodiments will be described with reference to FIGS. 10 to 14. FIG. 11 is a diagram showing an outline of a scanning electron microscope which is a kind of charged particle beam device. FIG. 11 is a diagram mainly illustrating a processing circuit that processes a signal obtained when a specimen is irradiated with an electron beam. A specimen 1305 is scanned with an electron beam 1302, which is extracted from an electron source 1301 by an extraction electrode (not shown) and is accelerated by an acceleration electrode, by a scanning deflector 1304 that scans the electron beam in accordance with a scanning signal supplied from a scanning signal generation unit 1303. Secondary electrons (SE) emitted from the specimen 1305 by the scanning of the specimen 1305 with the electron beam 1302 and emission electrons 1306 such as backscattered electrons (BSE) collide with a detection surface 1308 (phosphor) of the lower-stage detector 1307 to generate light. The generated light is guided to a photomultiplier tube 1310 by a light guide 1309. The photomultiplier tube 1310 is an element that converts light energy into electrical energy by using a photoelectric effect, and can increase the light energy and convert it into an electrical signal. The scanning electron microscope illustrated in FIG. 11 is also provided with an upper-stage detector 1320 in addition to the lower-stage detector 1307. Emission electrons 1322 that have passed through an opening provided on the detection surface 1308 of the lower-stage detector 1307 are deflected from an optical axis of the electron beam 1302 by a deflector 1321, and collide with the detection surface 1308 of the upper-stage detector 1320.

In the scanning electron microscope illustrated in FIG. 11, a negative voltage (retarding voltage) is applied to the specimen 1305, and electrons emitted from the specimen are accelerated toward a direction of the electron source 1301. Further, in the case of the optical system according to the present embodiment, secondary electrons that are relatively low in energy with respect to the backscattered electrons are dispersed so as to be separated from the electron beam optical axis due to a focusing action of an objective lens 1324. Thus, a relatively large number of secondary electrons are detected by the lower-stage detector 1308. On the other hand, an energy filter 1326 is disposed between the upper-stage detector 1320 and the deflector 1321, and backscattered electrons can be selectively detected by the upper-stage detector 1320 by applying a voltage equivalent to the retarding voltage. Further, since electrons (for example, secondary electrons) having low emission energy from the specimen are accelerated toward the direction of the electron source 1301, a large number of secondary electrons and the like can also reach the upper-stage detector 1320 without the energy filter. With respect to secondary electrons, a large number of electrons (for example, backscattered electrons) having a relatively high energy can reach the lower-stage detector 1307 since the electrons are less likely to be influenced by an electric field formed by the retarding voltage with respect to the specimen 1305 and are scattered without greatly changing an orbit from the emission orbit. Thus, a detection object by the detector can be switched depending on the device condition.

In the example of FIG. 11, a detector that detects a signal by directly colliding electrons emitted from the specimen with a phosphor or the like is employed. However, for example, a detection method, in which a secondary electron conversion electrode that generates additional secondary electrons by a collision of electrons is disposed at a position of the detection surface illustrated in FIG. 11 and the secondary electrons generated by the secondary electron conversion electrode are drawn to the detection surface of the detector by an attraction electric field, can also be employed.

In addition, as will be described later, the photomultiplier tube 1310 is capable of controlling an amplification factor, which can adjust the contrast of the image by controlling the amplification factor. An output signal of the photomultiplier tube 1310 is input to an amplifier circuit 1312 including a pre-amplifier (P) and a main amplifier (M) included in a control unit 1311 (image generation device), and is amplified by the amplifier circuit 1312. Further, as will be described later, the amplifier circuit 1312 can perform bias control and brightness adjustment. The output of the amplifier circuit 1312 is converted into a digital signal by an A/D converter 1313, and the signal is stored in frame memories 1314 and 1323. A frame memory 1316 stores an output signal of the A/D converter 1313 at an address corresponding to a pixel of a display device (not shown) in synchronization with the scanning signal of the scanning signal generation unit 1303.

A calculation processing unit 1315 reads out the signals stored in the frame memories 1314 and 1323, and generates a control signal to a contrast adjustment unit 1316 and a brightness adjustment unit 1317 by performing a calculation as will be described later.

The control unit 1311 generates an integrated image of N frames through a step exemplified in FIG. 12. An operation program for executing image processing including steps as exemplified in FIG. 12 is stored in a storage medium (not shown) in advance, and the control unit 1311 executes image generation processing in accordance with the operation program.

Figure 10B:
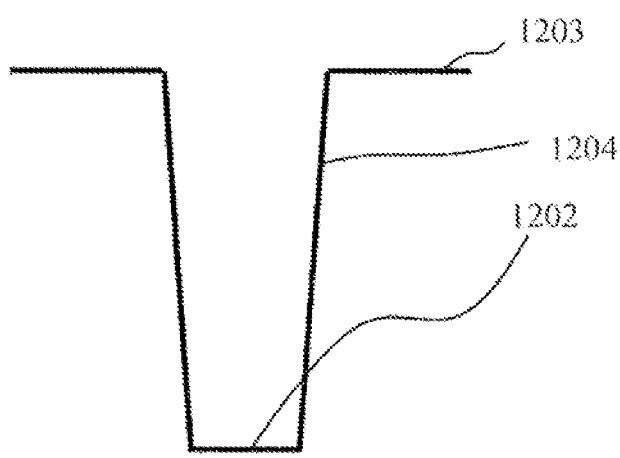
Figure 10C:
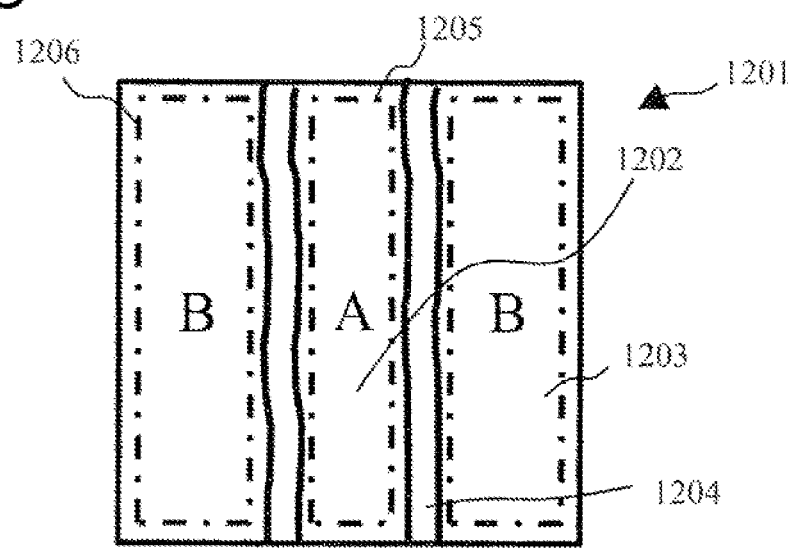

First, the control unit 1311 performs a scanning of a small number of frames (one frame in the example of FIG. 12), and generates an image by acquiring an image signal (steps 1401, 1402, and 1403). In the present embodiment, first, the image is generated on the basis of an output of the lower-stage detector 1307. FIG. 10(*a*) is a diagram showing an example of an image generated on the basis of a signal obtained by scanning a groove pattern with an electron beam. FIG. 10(*b*) is a cross-sectional view of the groove pattern. As described above, the lower-stage detector 1307 can detect a large amount of secondary electrons with respect to the backscattered electrons, and can obtain a signal sufficient to specify a shape of a pattern even from an image of a small number of frames as exemplified in FIG. 10(*a*). Next, region division is executed on the image generated on the basis of the output of the lower-stage detector 1307 as exemplified in FIG. 10(*c*) (step 1404). The region division in step 1404 is performed using, for example, an image signal stored in the frame memory 1323. In the case of a groove pattern as exemplified in FIG. 10, there is a tendency that a groove bottom 1202 is dark and a specimen surface 1203 is bright. In addition, since an edge portion 1204 has the highest luminance, the two regions divided by the high luminance portion are classified in accordance with the brightness thereof. In the case of the image exemplified in FIG. 10, an image region is divided into a region A1205 and regions B1206 to be divided by a high luminance region corresponding to the edge portion 1204. Other image processing methods may be used for region division.

Figure 13A:
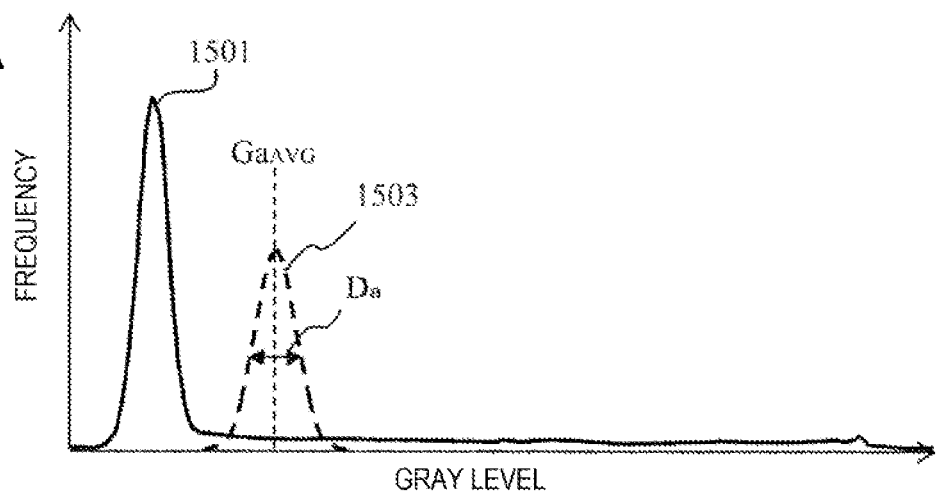
FIGS. 13A to 13C are diagrams showing an example of generating a combined histogram on the basis of statistical processing of gray level values of a plurality of luminance evaluation regions.
Figure 13B:
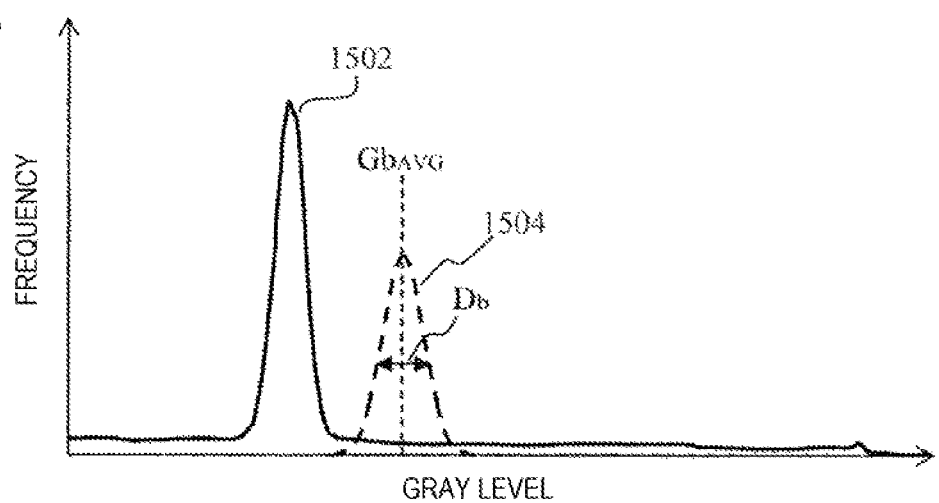
Figure 13C:
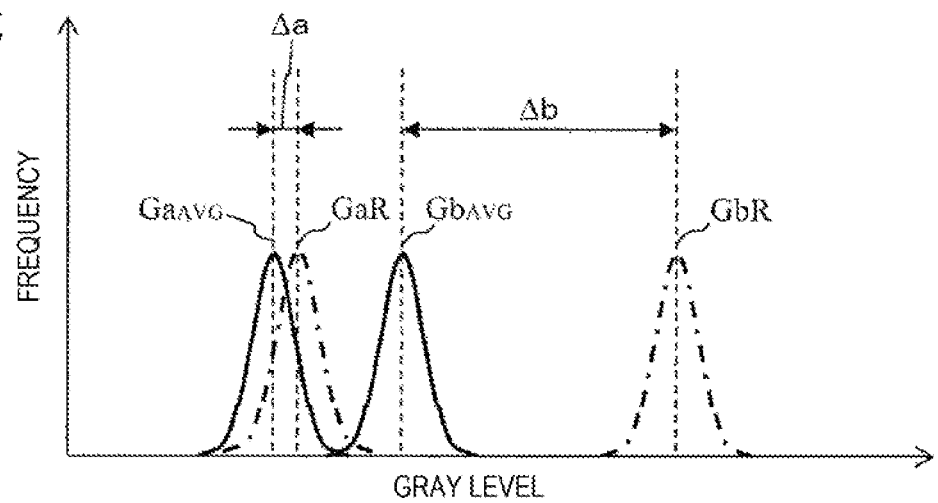
Figure 14A:
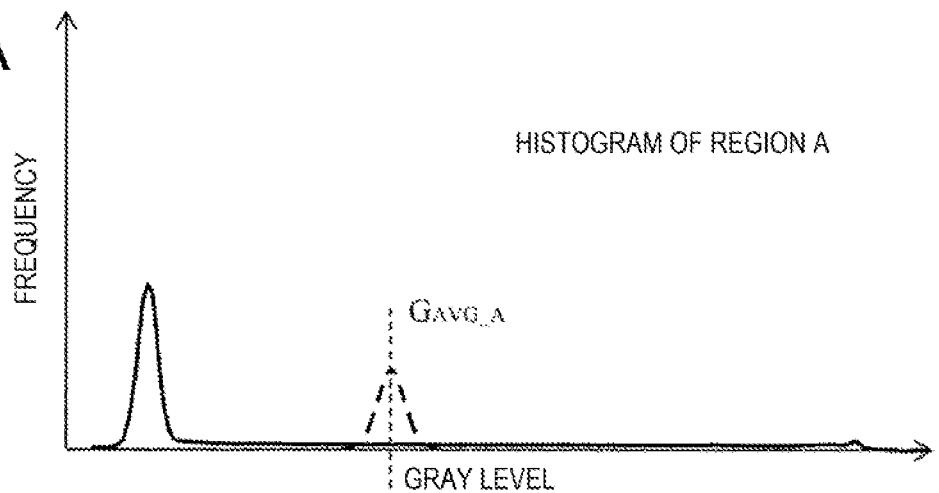
FIGS. 14A to 14C are diagrams showing an example of generating a combined histogram on the basis of statistical processing of gray level values of a plurality of luminance evaluation regions.
Figure 14B:
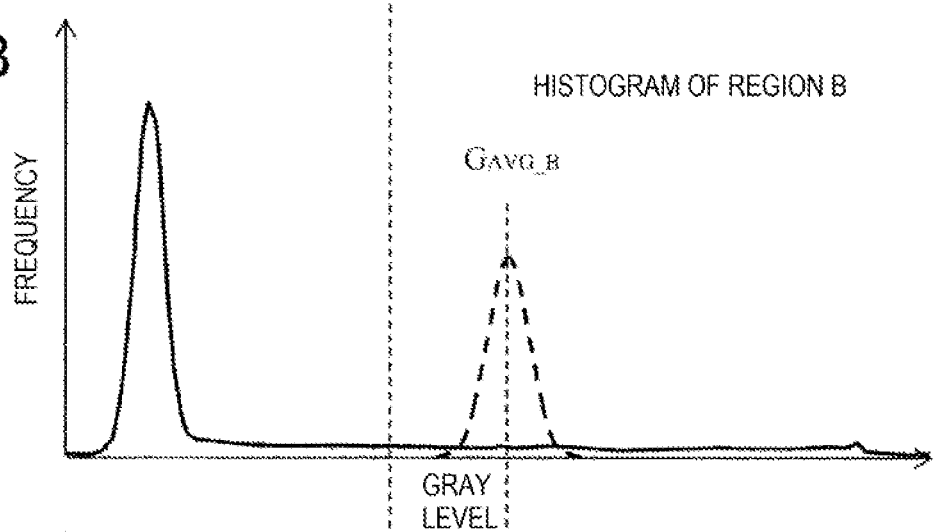
Figure 14C:
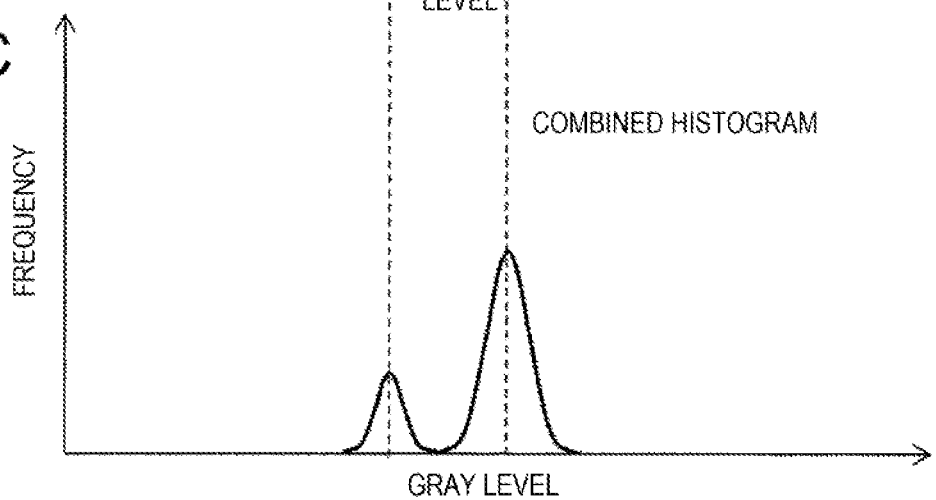
Figure 16A:
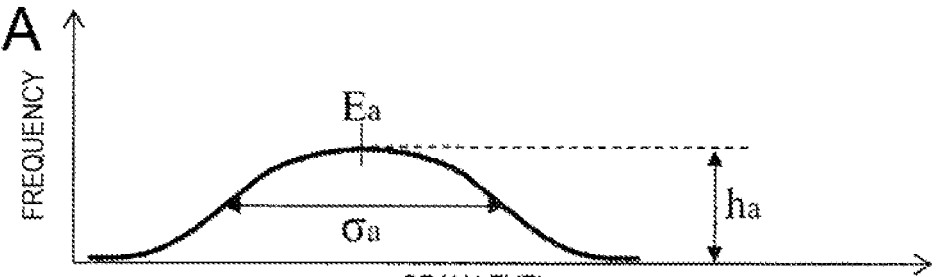
FIGS. 16A to 16E are diagrams illustrating a change in a variance value of the gray level when a focus condition is changed.
Figure 16B:
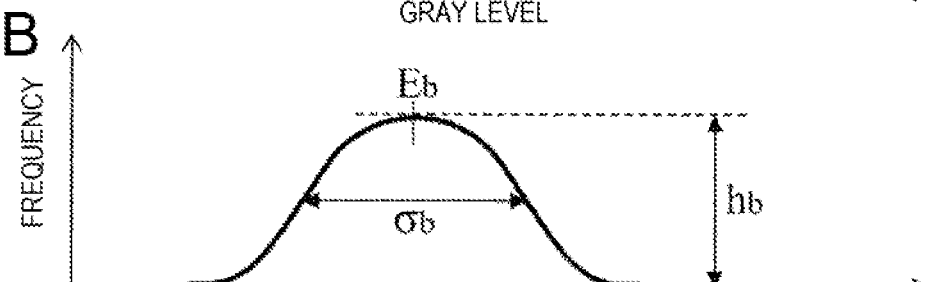
Figure 16C:
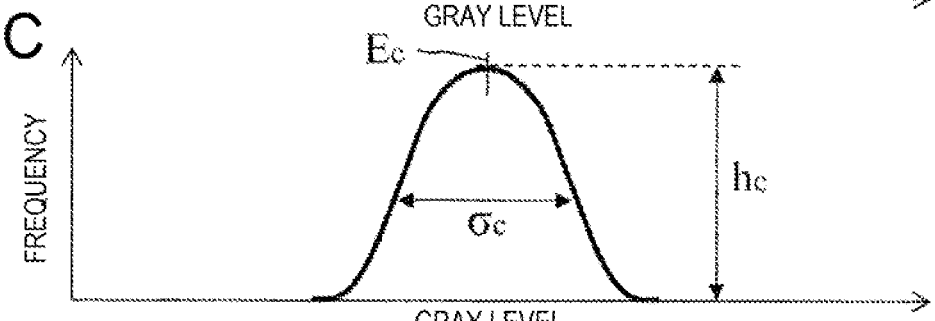
Figure 16D:
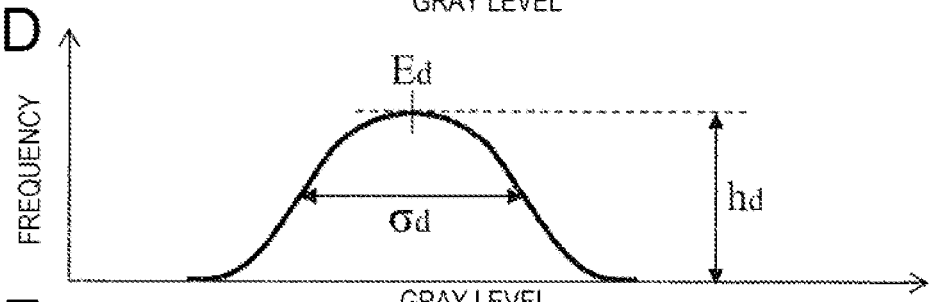
Figure 16E:
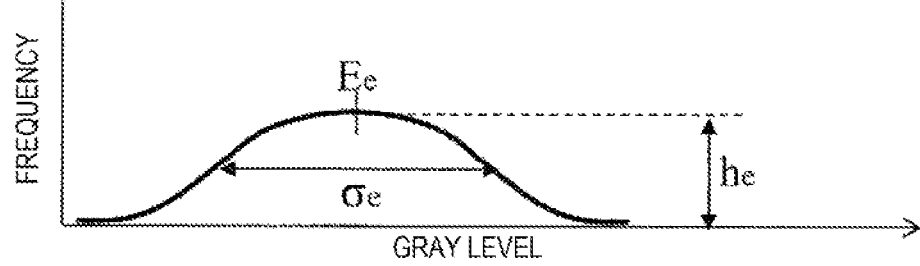

Next, a luminance histogram for each region unit obtained by the region division is generated (step 1405). An object of generating the luminance histogram is an image generated on the basis of the output of the upper-stage detector 1320, and the luminance histogram is generated for an output image region of the upper-stage detector corresponding to an image region specified on the basis of the output of the lower-stage detector. FIG. 13(*a*) exemplifies luminance distribution 1501 of the region A1205, and FIG. 13(*b*) exemplifies luminance distribution 1502 of the regions B1206. FIG. 13 shows an example of a histogram representing the gray level and the frequency of each pixel. The distributions 1501 and 1502 show the gray levels obtained by one frame scanning and the frequencies thereof. As characteristics of the distributions 1501 and 1502, luminance information showing an edge or the like of a pattern formed on a specimen is lacking, and there is a tendency to include a large number of low gray level signals caused by noise of the detector.

The electrons detected by the upper-stage detector 1320 are mainly backscattered electrons, the amount of which is smaller than that of the secondary electrons. Therefore, in an image of a small number of frames, it is difficult to generate an image enough to specify the shape of the pattern. In the present embodiment, in view of such a low yield of backscattered electrons, a lower-stage detector output that mainly detects secondary electrons is used to perform the region division of an image generated on the basis of the backscattered electron detection.

Next, the calculation processing unit 1315 calculates a statistical value of a luminance value of a pixel included in the regions A and B (step 1406). More specifically, $G_{aAVG}$, $G_{bAVG}$ are calculated by obtaining an average value of the luminance values of the pixels included in each of the regions A and B. Further, variances $D_a$, $D_b$ are obtained by using calculation formulas such as Formula 2, and Formula 3.

$$D = \frac{\sum \{s(x, y) - E\}^2}{M} \quad \text{(Formula 2)}$$

$$E = \frac{\sum s(x, y)}{M} \quad \text{(Formula 3)}$$

S (x, y) is a gray level value of pixel coordinates (x, y), E is an average of the gray level values, and M is a number of pixels in a region of interest (ROI). A peak 1503 having a peak position of $G_{aAVG}$ and a peak width of $D_a$, and a peak 1504 having a peak position of $G_{bAVG}$ and a peak width of $D_b$ are calculated on the basis of the calculation (step 1407).

Next, a combined histogram (waveform shown by a solid line in FIG. 13(*c*)) is generated by combining the two peaks 1503 and 1504 obtained as described above. By comparing the combined histogram generated in this manner with a reference histogram (waveform having two peaks of $G_{aR}$ and $G_{bR}$), differences (Δa and Δb) thereof and a difference (difference in variance value) of the peak width are obtained, and adjustment amounts of the contrast and the brightness are calculated so as to correct the differences (steps 1409 and 1410). At this time, a calculation formula or a table showing a relationship between the difference of the peak and the adjustment amount of a gain or the like is stored in a predetermined storage medium in advance and a proper gain adjustment amount or the like is obtained on the basis of the peak difference value calculation to execute the adjustment by the contrast adjustment unit 1316 or the like (step 1411).

An image signal of N frames is generated by performing the signal processing using a gain value and a bias value adjusted as described above while performing the scanning of a predetermined number (N frames), and an integrated image is generated by integrating images of N frames (steps 1412 and 1413). According to the present embodiment, an appropriate signal processing condition can be found before the scanning of the N frames. As a result, a signal processing condition for generating a desired image can be set in a short time. Particularly, when a backscattered electron image, in which a pattern can be recognized for the first time by integrating a large number of frame images, is generated, a proper ABCC condition can be obtained before the scanning of a large number of frames is actually performed.

In the case of an image including a hole or a trench pattern (region A) in the visual field, when an area of a specimen surface (region B) is larger with respect to the hole and the trench, the number of pixels on a surface side of the specimen increases. Therefore, as exemplified in FIG. 14, when peak positions ($G_{AVG\_A}$, $G_{AVG\_B}$) and a peak width are obtained on the basis of a statistical value, it is desirable to set a distribution height in accordance with a size of the region.

In addition, it is possible to obtain an appropriate adjustment amount of the ABCC in accordance with the pattern shape specification using the secondary electrons by storing a plurality of reference histograms corresponding to the type of the specimen in advance.

Third Embodiment

In the present embodiment, a device condition determination method when the visual field of the electron microscope is positioned will be described in order to perform a review of a foreign matter or the like on the basis of coordinate information of the foreign matter or the like. In such a device, there is a need to detect a material contrast instead of a detailed shape of the foreign matter in the visual field. The backscattered electrons are suitable for generating a contrast image in accordance with the type of the material. In the present embodiment, an electron microscope capable of automatically setting the device condition when the inspection of the foreign matter is performed on the basis of the detection of the backscattered electrons will be described.

In the present embodiment, after the distribution (E, σ) of each region is obtained by the method described in the second embodiment, it is possible to output an image by assigning a gray level value on the basis of the distribution to each region. A boundary line of the region may be displayed in black or white, and a gray level value in the case where there is no signal in advance may be acquired and assigned. In the latter method, it is possible to confirm the presence or absence of a signal in each region.

More specifically, first, a secondary electron image obtained by scanning of a small number of frames (for example, one frame) is used to perform identification of a defect such as a foreign matter and a region other than the defect. As described in the second embodiment, although the secondary electron image is difficult to have a contrast in accordance with a difference in material, it is easy to specify an edge of a foreign matter or the like, and shape determination can be performed with high accuracy. Therefore, it is possible to generate an integrated image under an appropriate ABCC condition by identifying the foreign matter and the region other than that and performing image generation following the step as exemplified in FIG. 12.

In addition, composition included in each region may be identified from the luminance information of each region obtained by performing the calculation up to step 1407. For example, a table in which association between the luminance information and composition information is stored may be prepared, and the composition may be identified by referring to the luminance information in the table. Further, the identification of the composition may be performed by obtaining in advance a luminance difference (yield difference of an amount of emission electrons) with silicon or the like constituting the semiconductor device, and referring the luminance difference between the luminance of the foreign matter and the defect to be reviewed and the silicon or the like as the reference information.

Fourth Embodiment

There is a need to focus on the bottom portion of the pattern when the measurement or inspection of the bottom portion is performed in a groove or hole structure of a three-dimensional pattern of a semiconductor. When the groove or the hole structure is deep with respect to the opening of the surface, strong signal discrimination is required to observe the bottom portion. Since it is necessary to visually recognize the bottom portion in order to focus, throughput is lowered in order to obtain the image. In such a case, a method of extracting focus information at high speed using the method described in the sixth embodiment is proposed.

Attention is directed to a bottom region 52 of FIG. 7. When the bottom portion is not focused, information of the bottom surface and the edge is included in this region. Therefore, a gray level value E at the bottom portion is smaller or larger than at a time of just-focusing under the influence of the gray level value of the edge. Similarly, a variance $\sigma^2$ becomes larger. The focus is changed to search for a maximum or a minimum of E or a minimum of $\sigma^2$. Then, the focus can be adjusted by setting the corresponding condition.

As shown in FIG. 8, the bottom portion region may be further divided into a plurality of regions 53 to 55. In this case, a condition is searched such that E and $\sigma^2$ of the plurality of regions are optimal. Further, a region including a bottom edge and a region at the center portion of the bottom surface may be set, and a condition under which the difference between the gray level values of the two regions becomes maximum may be searched.

When a function of automatically focusing, which is so-called autofocus, is implemented, the same control as in the related art may be performed on the basis of the focus information described above. That is, control is performed such that a focus position of the beam is changed by using an excitation current of the objective lens or the like, and a condition under which an index of the focus information becomes maximum or minimum is searched and set.

The accuracy of the focus depends on a region division method. It is possible to set automatically by a method such as setting a shape of the region division or a size of the region on the basis of the shape, size, depth or ratio of the opening of the pattern.

Hereinafter, a specific processing content of the autofocus will be described with reference to the drawings. The scanning electron microscope exemplified in FIG. 11 is provided with an objective lens 1324 and a lens condition control unit 1325 that controls an excitation current of the objective lens 1425. The control device 1311 executes autofocus processing as exemplified in FIG. 15. First, the lens condition control unit 1325 supplies an excitation current to the objective lens 1425 so as to satisfy a predetermined lens condition (step 1701). In the present embodiment, although an electromagnetic objective lens is described as an example, an electrostatic objective lens may also be used. Next, scanning of a small number of frames is performed to acquire an image as exemplified in FIG. 7 in a state where the set lens condition is maintained (step 1702). Next, a waveform position ($G_{AVG}$) of a luminance histogram of the ROI and a variance $\sigma$ thereof are obtained by averaging luminance values of a plurality of pixels included in the bottom portion region 52 (ROI set at the bottom portion of the trench) (statistical processing, step 1703). The variance $\sigma$ is used by replacing D obtained by using Formulas 2 and 3 with $\sigma^2$ (step 1704).

FIG. 16 is a diagram showing a change in variance $\sigma$ of a luminance histogram when a focus condition is changed from (a) to (e). As can be seen from FIG. 16, a lens condition of (c) has the smallest variance among (a) to (e). That is, under the condition (c), only the bottom portion of the trench is irradiated with the beam and the edge is not hit, and thus it can be seen that the range of the luminance distribution is narrow. The best focus condition is determined by repeating the lens condition change until finding the lens condition with the smallest variance in this way (step 1705). In addition, in order to determine the best focus condition, a predetermined number of focus adjustments may be performed to find the focus condition with the smallest variance.

The beam scanning can be performed under the focus condition suitable for the bottom portion of the trench or the hole by performing image integration based on the scanning of the predetermined number of frames while focusing the beam under the focus condition determined as described above.

In FIG. 15, the example in which the ROI is set on the image and the statistical processing of the pixel values in the ROI is performed has been described. However, as described in the second embodiment, the ROI may be selectively set in the trench on the basis of the pattern shape recognition by the upper-stage detector.

Further, the example in which the lens condition for the just-focus is obtained on the basis of the evaluation of the variance $\sigma$ has been described in the example described above. However, the lens condition may be obtained on the basis of the evaluation of a luminance average E and a peak height h of the luminance distribution. In the case of the backscattered electron images, since the edge portion tends to be dark, the image formed by a just-focus beam that does not include the edge portion is relatively bright with respect to the image including the edge portion. By using this phenomenon, the lens condition for the just-focus can be found by finding the lens condition with the highest luminance average E (or a predetermined value or more) and the lens condition with the highest peak height h (or a predetermined value or more).

Fifth Embodiment

When an image is stored by the method described in (B), a variation in measurement of the gray level values and a variation in the dimensional values derived therefrom can be detected by adding statistical information such as variance along with the gray level value of each pixel. The variance value may be regarded as a gray level value and added as image information, and calculated numerical values may be added as they are. Further, a base function for calculating a gray level value or a variance may be used as main information, and an image on the basis of the gray level value acquired by integration may be added. An analysis can be performed using a computer or a personal computer outside the device on the basis of the statistical information.

REFERENCE SIGN LIST 1 charged particle beam device
2 mirror
3 signal conversion unit
4 statistical processing unit
5 display
6 detector
7 charged particle source
8 charged particle beam
9 specimen
10 signal
11 charged particle beam device
12 mirror
13 signal conversion unit
14 statistical processing unit
15 display
16 detector
17 charged particle source
18 beam
19 specimen
20 signal
21 bottom portion
22 surface
23 bottom portion
24 surface
25 example of linear region
34 main detector
35 sub-detector
36 statistical processing unit
37 detector parameter calculation unit
38 statistical calculation unit
39 statistical extraction unit
40 pattern detection unit
41 display
42 signal conversion unit
43 charged particle source
44 charged particle beam
45 specimen
46 signal
47 conversion electrode
48 image of sub-detector
49 bottom portion region
50 image of main detector
51 bottom portion region
52 region
53 region
54 region
55 region
56 groove pattern
57 coordinate axis
58 Eq (x)

The invention claimed is:

1. A charged particle beam device comprising:
a detector that detects charged particles obtained on the basis of irradiation of a specimen with a charged particle beam emitted from a charged particle source; and
a control unit that processes a signal obtained on the basis of output of the detector, wherein
the control unit is an image processing device that integrates a plurality of frame images to generate an integrated image, and
the control unit performs, before irradiation of the charged particle beam for generating the integrated image, statistical processing on gray level values of frames in a predetermined region of an image generated on the basis of the output of the detector, the number of the frames subject to the statistical processing being smaller than the number of the frames of the integrated image, and
executes signal processing that corrects a difference between a statistical value obtained by the statistical processing and reference data relating to gray level values of the image, thereby generating the integrated image.

2. The charged particle beam device according to claim 1, wherein
the control unit adjusts contrast and brightness of an image obtained on the basis of an output signal of the detector so as to correct a difference between an average value of the gray level values in the predetermined region and the reference data.

3. The charged particle beam device according to claim 1, wherein
the control unit is an image processing device that integrates a plurality of frame images to generate an integrated image, and performs signal detection so as to generate the integrated image under a changed device condition after changing the device condition in order to perform the signal processing.

4. The charged particle beam device according to claim 1, wherein
the control unit calculates each of the statistical values in a plurality of regions of an image generated on the basis of the output of the detector.

5. The charged particle beam device according to claim 4, wherein
the control unit generates a luminance histogram having a plurality of peaks on the basis of a plurality of statistical values calculated in each of the plurality of regions of the image.

6. The charged particle beam device according to claim 4, wherein
the plurality of regions include a defect region on a specimen and a region other than the defect region.

7. The charged particle beam device according to claim 1, wherein
the control unit is an image processing device that integrates a plurality of frame images to generate an integrated image, which includes a first detector and a second detector that detect charged particles obtained on the basis of irradiation of a specimen with the charged particle beam, the statistical processing is performed on the basis of a signal obtained by the first detector, and the integrated image is generated on the basis of output of the second detector.

8. The charged particle beam device according to claim 7, wherein
a change of a device condition is performed in order to perform the signal processing on the basis of output of the first detector.

9. The charged particle beam device according to claim 8, wherein
the first detector is a detector that detects secondary electrons.

10. The charged particle beam device according to claim 1, wherein
the control unit calculates a gray level value of the predetermined region and a variation thereof.

11. A charged particle beam device comprising:
an objective lens that focuses a charged particle beam emitted from a charged particle source;
a detector that detects charged particles obtained on the basis of irradiation of a specimen with the charged particle beam; and
a control unit that processes a signal obtained on the basis of output of the detector, wherein
the control unit is an image processing device that integrates a plurality of frame images to generate an integrated image,
the control unit performs, before irradiation of the charged particle beam for generating the integrated image, statistical processing on gray level values of frames in a predetermined region of an image generated on the basis of the output of the detector, the number of the frames subject to the statistical processing being smaller than the number of the frames of the integrated image, and
the control unit executes signal processing that corrects a difference between a statistical value obtained by the statistical processing and reference data relating to gray level values of the image, thereby generating the integrated image, and
the control unit adjusts a lens condition of the objective lens so as to reduce a variance value obtained on the basis of gray level values in a predetermined region of an image generated on the basis of the output of the detector.

* * * * *